United States Patent [19]
Jung

[11] Patent Number: 5,313,080
[45] Date of Patent: May 17, 1994

[54] STRUCTURE OF A CCD IMAGE SENSOR PARTICULARLY ON AN INTERLINE TRANSFER METHOD

[75] Inventor: Hun J. Jung, Kyungki-do, Rep. of Korea

[73] Assignee: Gold Star Electron Co., Ltd., Chungcheongbuk-Do, Rep. of Korea

[21] Appl. No.: 98,566

[22] Filed: Jul. 27, 1993

Related U.S. Application Data

[63] Continuation of Ser. No. 834,672, Feb. 12, 1992, abandoned.

[30] Foreign Application Priority Data

Feb. 13, 1991 [KR] Rep. of Korea ............... 2472/1991

[51] Int. Cl.$^5$ ............... H01L 29/796; H01L 27/14
[52] U.S. Cl. ............... 257/223; 257/224; 257/233
[58] Field of Search ............... 357/24, 30; 377/57–63; 257/222, 223, 230, 232, 233, 224

[56] References Cited

U.S. PATENT DOCUMENTS

| | | | |
|---|---|---|---|
| 4,028,716 | 6/1977 | Van Santen et al. | 357/24 M |
| 4,527,182 | 7/1985 | Ishihara et al. | 357/24 LR |
| 4,748,486 | 5/1988 | Miyatake | 357/24 LR |
| 4,984,044 | 1/1991 | Yamamura | 357/24 LR |

Primary Examiner—Gene M. Munson
Attorney, Agent, or Firm—Faegre & Benson

[57] ABSTRACT

A p type well is formed on an n type substrate and photodiode and VCCD regions are repeatedly at predetermined intervals in turns on the surface of the p type well.

In an interline transfer image sensor, the p type well is formed on the n type substrate and the photodiode and VCCD region of predetermined intervals are repeatedly formed in turn on the surface of the p type well. The p$^+$ type channel ion stop layer is formed at both edges of the VCCD region and the pinning voltage is applied to the p$^+$ type channel stop layer. Accordingly, the variable potential of the potential contour of the VCCD region is increased and the storing capacity of the charge and the efficiency of the charge transfer are maximized side by side.

4 Claims, 3 Drawing Sheets

STRUCTURE OF A CCD IMAGE SENSOR PARTICULARLY ON AN INTERLINE TRANSFER METHOD

This is a continuation of copending application Ser. No. 07/834,672 filed on Feb. 12, 1992, now abandoned.

BACKGROUND OF THE INVENTION

The present invention relates to a CCD (Charge Coupled Device) image sensor, and more particularly to an interline transfer CCD image sensor.

In general, an interline transfer CCD image sensor is formed on a plane to be corresponded with 1:1 for a photodetection sensor and a signal transfer region, and is applied to a household system, such as a television receiver or a cam-coder, which comparatively does not require a high degree of image stability, rather than to broadcasting equipment or military equipment, which do require a high degree of image force or stability.

With reference to FIG. 3 through FIG. 6, a conventional interline transfer CCD image sensor will be described below.

Hereinafter, each of the odd numbered horizontal lines, in which the photodiodes 31 are arranged, are referred to as an odd horizontal line, and each of the even numbered horizontal lines are referred to as an even horizontal line.

FIG. 3 shows a block diagram of a conventional interline transfer CCD image sensor. Each photodiode 31 is respectively connected to a corresponding buried channel VCCD (Vertical Charge Coupled Device) region 32 so as to transfer an image signal charge to the VCCD region 32 in one direction only. Each VCCD region 32 is operatively connected to an HCCD (Horizontal Charge Coupled Device) 33, to simultaneously transfer image signal charges transferred from each photodiode 31 to the HCCD by a conventional four phase clocking operation in accordance with 1st through 4th clock signals $V_{\phi 1} \sim V_{\phi 4}$.

Further, an output gate 34, a floating diffusion region 35, a reset gate electrode 36 and a reset drain 37 are connected in turn to the output side of the HCCD region, and a sense amplifier 38 is connected to the floating diffusion region 35.

FIG. 4 shows a portion of a layout diagram of the CCD image sensor of FIG. 3. A channel stop region 39 is formed between VCCD region 32 and photodiode 31. Odd gate electrode 40, which is connected to receive first and second VCCD clock signals $V_{\phi 1} \sim V_{\phi 2}$, is formed on the upper side of channel stop region 39 and VCCD region 32, to connect to each transfer gate 41 of the photodiodes 31 arranged on the odd horizontal line. Even gate electrode 42, which is connected to receive third and fourth VCCD clock signals $V_{\phi 3} \sim V_{\phi 4}$, is formed on the upper side of the VCCD region 32 to connect to each transfer gate 43 of the photodiodes 31 arranged on the even horizontal line.

Since odd gate electrode 40 and even gate electrode 42 must be the same type, they can be successively, repeatedly formed, and odd gate electrode 40 and the even gate electrode 42 are electrically isolated through insulating material (not shown).

Further, each transfer gate 41, 43 and each odd and even gate electrode 40, 42 is formed from polysilicon material. Odd gate electrode 40 is formed at the lower side and at the upper side of the photodiode 31 of the odd horizontal line, and consists of the second odd gate electrode 40b connected to each transfer gate 41 of the photodiode 31, to which is applied the first VCCD clock signal $V_{\phi 1}$, and formed at each odd horizontal line.

The even gate electrode 42 is formed at the lower side and at the upper side of the photodiodes 31 of the even horizontal line. The first gate electrode 42a, which is connected to receive the fourth VCCD clock signal $V_{\phi 4}$, and which consists of the second even gate electrode 42b, connected to the transfer gate 43 of the photodiodes 31, which connected to receive the third VCCD clock signal $V_{\phi 3}$, and formed at each even horizontal line.

Further, the two fields, designated as even and odd are generated by the first through the fourth VCCD clock signals $V_{\phi 1} \sim V_{\phi 4}$. The operation of the clocking of the VCCD region will be discussed later herein in detail.

FIG. 5 shows a cross-sectional view taken along the line a-a' of FIG. 4. A p type well 45 is formed on the n type substrate 44. The n type VCCD region 32 of the n type photodiodes 31, forming the even horizontal line, is successively arranged in a predetermined interval and in a connected shape through the channel stop region 39. The transfer gate 43, for transferring the charge, is formed above the upper side of well 45 between and above each photodiode 31 and each corresponding VCCD region 32. The second even gate electrode 42b, which is connected to receive the 3rd VCCD clock signal $V_{\phi 3}$, is formed at the upper side of each VCCD region 32 to connect to each transfer gate 43 of the photodiodes 31 of the even horizontal line.

The $p^+$ type thin film 46 is formed on the surface of each photodiode 31 to ordinarily apply the initial bias. The conventional interline transfer CCD image sensor is operated as follows.

The image sensor charge generated at the photodiodes 31 by the VCCD clock signal voltage applied to the gate electrode 42 of FIG. 5, is transferred to the VCCD region, and successively is transferred to the HCCD region 33 shown in FIG. 3. At this time, the potential contour out of the VCCD region 32 is changed, as shown in FIG. 6, with the potential contour of the line b-b' of FIG. 5. Namely, in FIG. 6, it is known that the potential contour is gradually brought down when the VCCD clock signal voltage is reduced from the voltage $V_1$ to the $V_5$.

However, it is known that the potential contour of the VCCD region is not reduced further even though the voltage of the VCCD clock signal is reduced to less than the voltage $V_3$, as shown in FIG. 6, because the p type well 45 of FIG. 5 is connected to receive a 0V voltage by connection to ground bias as is channel stop region 39. Here, the voltage magnitude at which point the potential contour is not reduced further, is ordinarily called the pinning voltage (Vp: Pinning Voltage).

Consequently, the conventional interline transfer CCD image sensor shown in FIG. 5, even though the VCCD clock signal voltage is actually reduced less than the voltage $V_3, V_{\phi 1}$, this negative voltage is only applied to the insulation film (not shown, but formed between the surface of VCCD region 32 and the gate electrode 42) and has no effect in the VCCD region 32.

Ultimately, the controlling extent is narrow for controlling the transfer efficiency of the image signal charge out of the VCCD region in accordance with need of the user.

The conventional art as above cannot reduce the pinning voltage, even though a large negative voltage is applied to the gate electrode, because the pinning voltage is only determined by the VCCD output signal. Therefore, since the transfer width of the potential contour out of VCCD region has this limitation, the storage capacity of the image signal charge and the efficiency of the charge transfer cannot be maximized.

The above conventional art is discussed in an article entitled A Very Small "Super-8 Format CCD Imager for a Single-Chip Color Camera" published at page 1446 of the IEEE Transaction on Electron Devices, VOL. 38, NO. 5, in May 1991.

SUMMARY OF THE INVENTION

The object of the present invention is to maximize the storage efficiency of an image signal charge in a CCD image sensor and the transfer efficiency in the VCCD region by reducing the pinning voltage.

In order to achieve the above object according to the present invention, the p type well is formed on the n type substrate, and the n type photo diode and the n type VCCD region are repeatedly formed in turn on the surface of the p type well, the p+ type channel stop region is formed at the edge part of the n type VCCD region. At this time, the electrode to apply the pinning voltage Vp is prepared on the each p+ layer channel stop region. Accordingly, the pinning voltage can be reduced in order that the transfer width of the potential contour is increased in the VCCD region.

Figure 1:
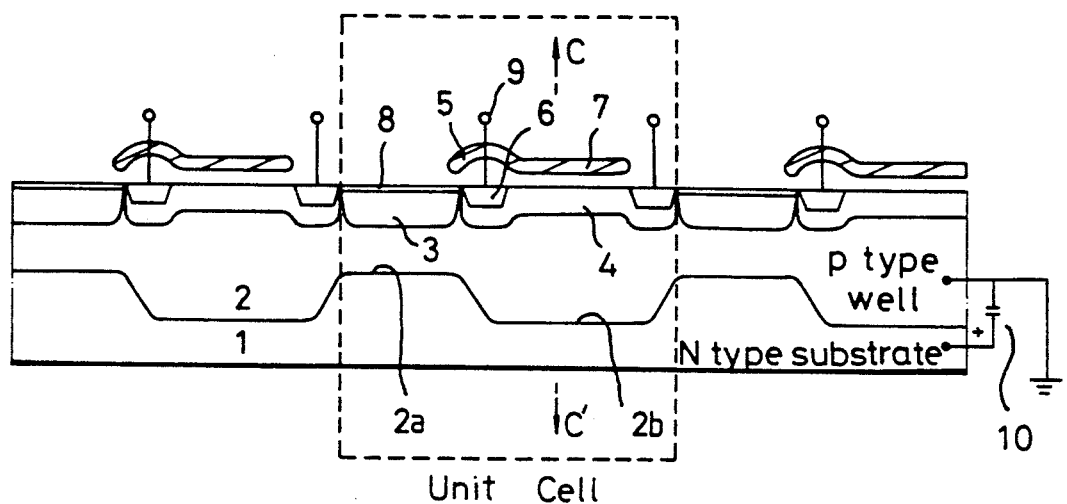
FIG. 1 is a vertical section of a CCD image sensor according to the present invention.

The reference characters for the principal parts of FIG. 1 are as follows:

| 1: n type substrate | 2: p type well |
| 3: photo diode | 4: VCCD Region |
| 5: transfer gate electrode | |
| 6: p+ type channel stop region | |
| 7: gate electrode | |
| 8: p+ thin film layer | |
| 9: pinning voltage terminal | |
| 10: shutter voltage applied power | |

DETAILED DESCRIPTION OF THE INVENTION

With reference to the Figures, the CCD image sensor of the present invention may be explained in detail as follows.

FIG. 1 shows a vertical section of the CCD image sensor according to the present invention. The improved CCD image sensors of the present invention are arranged as shown in FIG. 3.

As shown in FIG. 1, the p type well 2 is formed, and the n type photodiode 3 and the buried channel n type VCCD region 4 are repeatedly formed in turn on the surface of the p type well 2, and the p+ channel stop region 6 of predetermined width is formed at both edges of the n type VCCD region 4 to isolate adjacent unit cells.

The doping density of the n type VCCD region 4 shielding the p+ channel stop region 6 from p type well 2 is formed from thinner width n− type material than the density of the same n type VCCD region 4, therefore its potential is higher than the other parts. The operation of the present invention is as follows.

Figure 3:
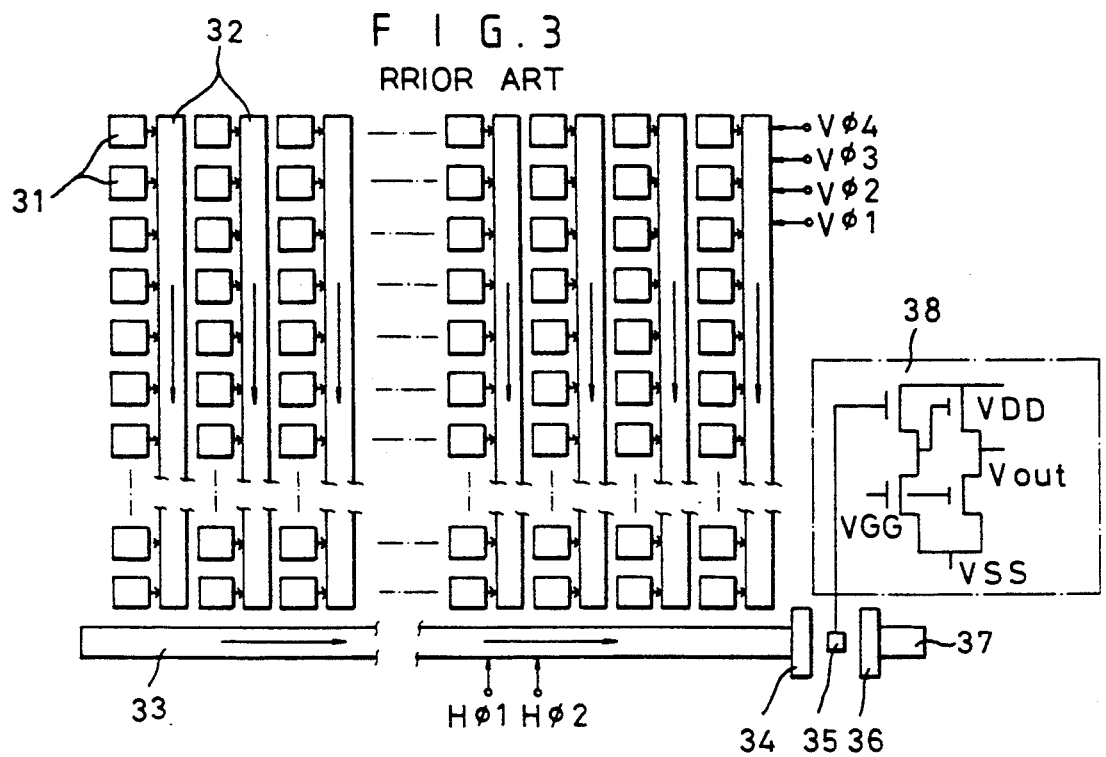
FIG. 3 is a block diagram of a CCD image sensor of a general interline transfer method.
Figure 4:
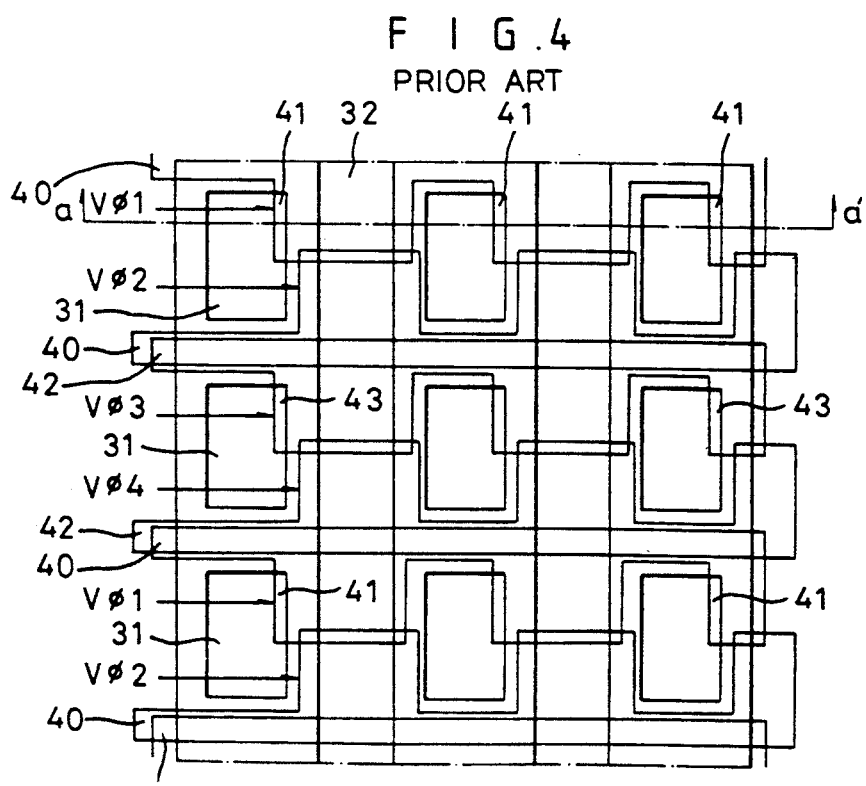
FIG. 4 is a layout diagram of a specific part of the sensor of FIG. 3.
Figure 5:
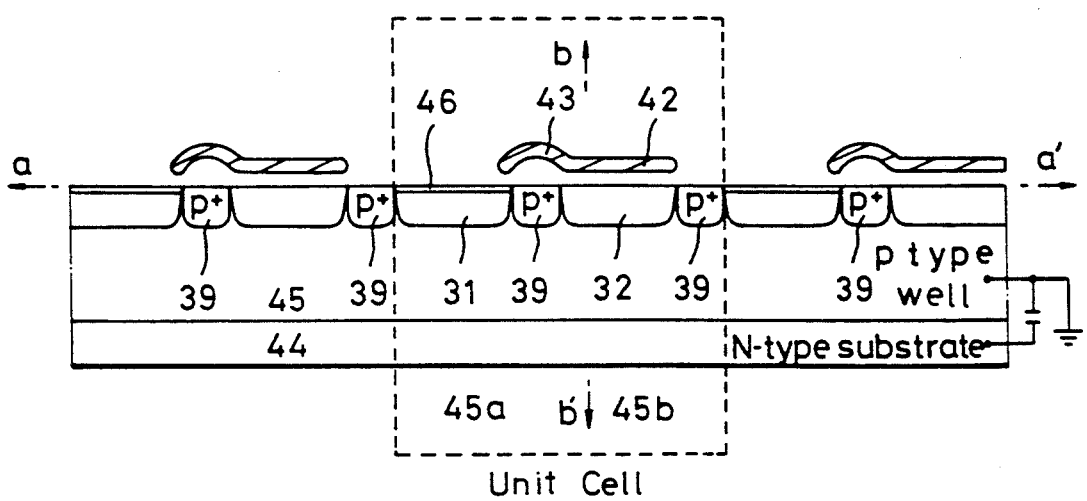
FIG. 5 is a vertical section of a CCD image sensor of a conventional interline transfer method.
Figure 6:
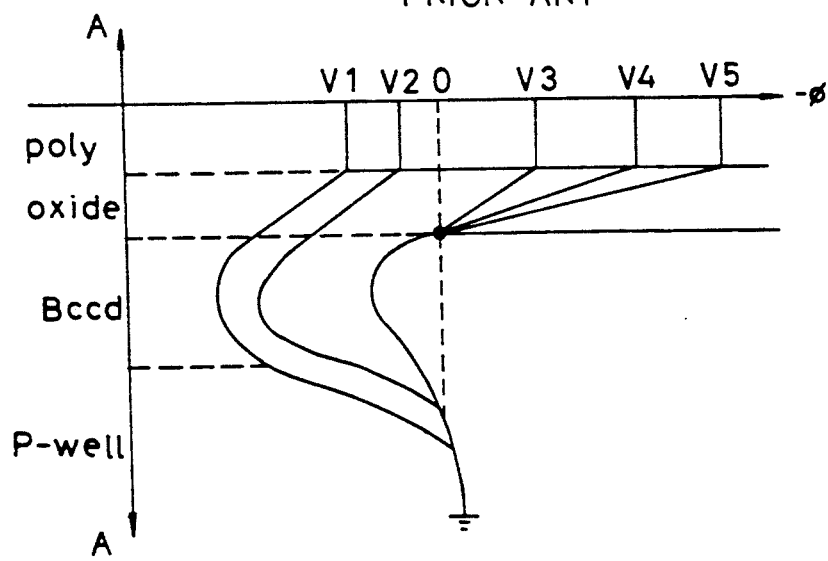
FIG. 6 is a potential contour degree according to FIG. 3.

The image signal charge generated from the photodiode 3 is transferred to VCCD region 4 by a VCCD clock signal voltage applied to the gate electrode 7 in a manner analogous to that of the prior art shown in FIG. 1, and then the image signal charge having been transferred to the VCCD region is transferred to the HCCD regions 33 shown in FIG. 3.

Figure 2:
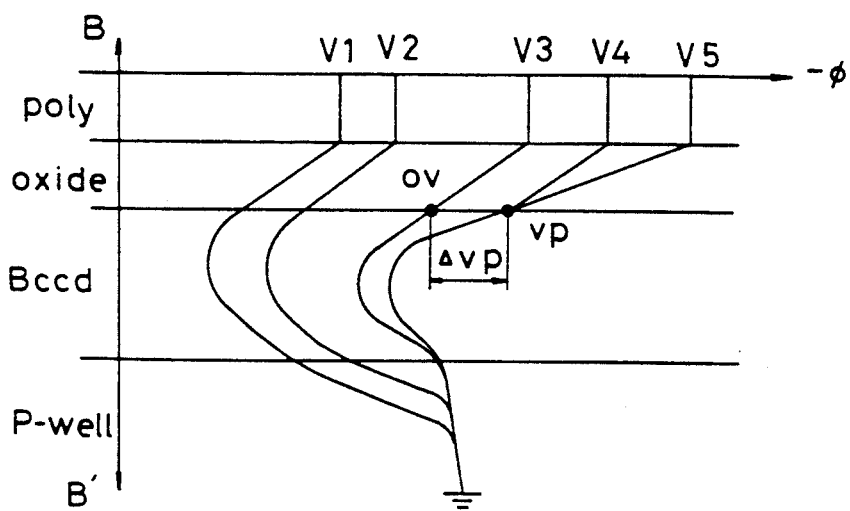
FIG. 2 is a potential contour degree according to FIG. 1.

FIG. 2 is the potential contour degree (potential profile) on the line c–c' of FIG. 1 and shows the various potential contours of the VCCD region 4 according to the size of the VCCD clock signal voltage applied to the gate electrode 7. It is known that the potential is gradually reduced as the potential contour is varied from $V_1$, to $V_5$ of the VCCD clock signal voltage applied to the gate electrode. Here, the application of a negative pinning voltage to the above gate electrode 7 is only related to the oxide film between the VCCD region 4 and the gate electrode 7 (not shown), and has no effect on the potential distribution of the VCCD region 4.

As the negative voltage is uniformly applied and the VCCD clock signal voltage is varied through the pinning voltage applied to the terminal 9 connected to p+ type channel stop region 6 of FIG. 1, the pinning voltage is reduced, thereby reducing the potential contour degree is also reduced. Namely, in the case that the effective limit of the substantial variable extent of the prior art was in $V_1 \sim V_3$, the present invention could be variable throughout the range from $V_1$ to $V_5$, thereby $\Delta V_p$ was reduced.

According to the above explanation, since the present invention had applied the negative voltage of the extent required by the user through the pinning voltage applied to terminal 9 of the channel stop region 6, the transfer width of the potential contour was increased, and then the storing capacity of the charge and the efficiency of the charge transfer are maximized. Namely, $$\Delta Q = C \Delta V \qquad 1)$$

As known through the formula related to the charge capacity shown in the above, as $\Delta V$ becomes larger according to the present invention, the storing capacity of the charge becomes larger, and at the same time, the efficiency of the charge transfer is maximized side by side.

What is claimed is:

1. A structure of a charge coupled device (CCD) image sensor comprising:
    a second conductive type well formed on a first conductive type substrate;
    a plurality of first conductive type optical detection regions and a plurality of first conductive type buried channel regions (BCCDs) repeatedly formed in turn adjacent to one another on a surface of the second conductive type well; and second conductive type channel stop regions formed on each buried channel region at opposite edges of each buried channel region (BCCD) and adjacent to the optical detection regions.

2. A structure of CCD image sensor as defined in claim 1 wherein an electrode to apply a pinning voltage is operatively connected to a channel stop region.

3. A structure of CCD image sensor as defined in claim 1 wherein the buried channel region is formed, such that the doping density of a part surrounding the channel stop region is formed in lower than the remainder of the buried channel region.

4. A structure of a CCD image sensor as defined in claim 1 wherein the second conductive type well is formed such that a shallow type well is formed at a lower side of an optical detection region and a deep type well is formed at a lower side of the buried channel region.

* * * * *

UNITED STATES PATENT AND TRADEMARK OFFICE
CERTIFICATE OF CORRECTION

PATENT NO. : 5,313,080
DATED : May 17, 1994
INVENTOR(S) : Hun J. Jung It is certified that error appears in the above-identified patent and that said Letters Patent is hereby corrected as shown below:

On the title page, item (54), and column 1:
    In the title, line 2, delete "ON" and insert --OF--

Column 5, line 5, after "of" insert --a--

Signed and Sealed this

Thirtieth Day of August, 1994

Attest:

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,313,080
DATED : May 17, 1994
INVENTOR(S) : Hun J. Jung

It is certified that error appears in the above-indentified patent and that said Letters Patent is hereby corrected as shown below:

In the title, line 2, delete "ON" and insert --OF--

Column 5, line 5, after "of" insert --a--

Column 5, line 7, after "region" insert --, said pinning voltage maintaining a lowest value of voltage applied to an upper side of the BCCD region with a voltage applied to the channel stop region--.

This certificate supersedes Certificate of Correction issued August 30, 1994.

Signed and Sealed this

Fourth Day of October, 1994

Attest:

BRUCE LEHMAN

Attesting Officer      Commissioner of Patents and Trademarks